(12) United States Patent
Milne et al.

(10) Patent No.: US 7,372,074 B2
(45) Date of Patent: May 13, 2008

(54) SURFACE PREPARATION FOR SELECTIVE SILICON FUSION BONDING

(75) Inventors: James C. Milne, Issaquah, WA (US); Leonard J. McNally, Woodinville, WA (US)

(73) Assignee: Honeywell International, Inc., Morristown, NJ (US)

( * ) Notice: Subject to any disclaimer, the term of this patent is extended or adjusted under 35 U.S.C. 154(b) by 129 days.

(21) Appl. No.: 11/247,700

(22) Filed: Oct. 11, 2005

(65) Prior Publication Data

US 2007/0082420 A1    Apr. 12, 2007

(51) Int. Cl.
*H01L 29/04* (2006.01)
*H01L 31/036* (2006.01)
*H01L 23/02* (2006.01)
*H01L 23/12* (2006.01)
*H01L 23/06* (2006.01)

(52) U.S. Cl. .................. 257/50; 257/678; 257/704; 257/684

(58) Field of Classification Search ............... 257/50, 257/52, 678, 704, 684, 687
See application file for complete search history.

(56) References Cited

U.S. PATENT DOCUMENTS

| | | | |
|---|---|---|---|
| 5,273,205 A | 12/1993 | Ju et al. | |
| 5,286,271 A | 2/1994 | Rueter et al. | |
| 5,919,548 A | * | 7/1999 | Barron et al. ............... 428/138 |
| 6,629,465 B1 | 10/2003 | Maluf et al. | |
| 7,005,732 B2 | * | 2/2006 | Horning et al. ............. 257/678 |

OTHER PUBLICATIONS 30 pages of lecture: Micro-Technology, Technology & Applictions, Ole Hansen MIC, Aug. 19, 2002.

* cited by examiner

*Primary Examiner*—Chuong A. Luu
(74) *Attorney, Agent, or Firm*—Black Lowe & Graham PLLC

(57) ABSTRACT

An apparatus and method for a silicon-based Micro-Electro Mechanical System (MEMS) device, including a pair of silicon cover structures each having a substantially smooth and planar contact surface formed thereon; a silicon mechanism structure having a part thereof that is movably suspended relative to a relatively stationary frame portion thereof, the frame portion being formed with substantially parallel and spaced-apart smooth and planar contact surfaces; a relatively rough surface disposed between the contact surfaces of the covers and corresponding surfaces of the movable part of the mechanism structure; and wherein the contact surfaces of the cover structures form silicon fusion bond joints with the respective contact surfaces of the mechanism frame.

15 Claims, 4 Drawing Sheets

SURFACE PREPARATION FOR SELECTIVE SILICON FUSION BONDING

FIELD OF THE INVENTION

The present invention relates to fusion bonding methods for use in fabricating silicon MEMS devices, and in particular to surface preparation methods for selective silicon fusion bonding.

BACKGROUND OF THE INVENTION

Silicon fusion bonding is used commercially to join together two or more silicon wafers, one or more of which may be oxidized.

The details of silicon fusion bonding are well published in the literature.

Silicon fusion bonding uses temperature and pressure to join atomically flat silicon wafers, one or more of which may be oxidized. General requirements for direct wafer fusion bonding include cleanliness and surface chemistry. General requirements for direct wafer fusion bonding also include microscopic smoothness with, and macroscopic flatness with RMS roughness of at most a few Ångströms and significantly less than 1.0 nanometer.

Any two flat, highly polished, clean surfaces will stick together if they are brought into contact. The bond is of the Van der Waal's, or hydrogen type and is of low strength, but can be significantly improved by thermal treatment. This silicon fusion bonding process has been successfully exploited for MEMS fabrication, using silicon-to-silicon fusion bonding with either plain or oxidized wafers.

Compared with anodic bonding, silicon fusion bonding results in exact thermal expansion matching that minimizes stress in bonded wafers; fusion bonded wafers have higher temperature capability whereas anodic bonding is limited by strain point of the glass; and fusion bonded wafers can be used for subsequent IC processing, whereas the anodic bonding process introduces alkali metal ions that cannot be allowed in CMOS processing.

However, surface roughness is a limiting factor in silicon fusion bonding. Surface roughness requirements for silicon fusion bonding is significantly less than 1.0 nanometer, being on the order of only few Ångströms. Fusion bonding of silicon or silicon dioxide requires that both surfaces be highly polished and smooth. If an oxide is deposited on the wafers, surface roughness may be too great to permit effective bonding. Thermal oxidation of the wafers typically results in lower surface roughness.

Wafer flatness or flexibility also limits bonding. If the wafers are warped, then the amount of surface area in close enough proximity is not sufficient to bond. Bowing in normal thickness wafers must be very small, as well as the surface roughness. Thinner wafers tend to deform easier and can overcome bow that thick wafers will not bond to normally.

Another limiting factor is surface chemistry. It is generally accepted that for silicon fusion bonding, hydrogen bonds dominate the strength or degree of bonding. Therefore, cleaning wafers in Piranha clean or another oxidizing bath immediately prior to bonding generally improves bonding.

Methods for fusion bonding of silicon are generally well-known. State-of-the-art silicon fusion bonding processes are disclosed, by example, in each of U.S. Pat. No. 5,286,671, "Fusion bonding technique for use in fabricating semiconductor devices;" U.S. Pat. No. 5,273,205; "Method and apparatus for silicon fusion bonding of silicon substrates using wet oxygen atmosphere;" and U.S. Pat. No. 6,629,465, "Miniature gauge pressure sensor using silicon fusion bonding and back etching," which are all incorporated herein by reference. U.S. Pat. No. 5,286,671, for example, teaches a method for fabricating silicon-on-insulator (SOI) wafers by fusion bonding two silicon wafers.

Silicon fusion bonding is used in manufacture of Micro-Electro Mechanical System (MEMS) devices, of which monolithic silicon based sensors and actuators are subsets. MEMS silicon based sensor and actuator devices are generally well-known.

FIG. 1 is a simplified illustration of a generic MEMS device 1 of the prior art having one or more movable parts, such as a movable pendulum. As illustrated, the MEMS device 1 includes a silicon mechanism structure 2 sandwiched between two silicon substrates 3, 4 that form respective covers 5, 6 over the mechanism structure 2. The mechanism structure 2 may be formed of an epitaxial layer of silicon grown on one of the two silicon substrates 3, 4 that form the cover 5, 6, for example the silicon substrate 3 that form the lower cover 5. The mechanism structure 2 often includes one or more movable parts 7 such as a movable pendulum that is flexibly suspended by one or more flexures 8 from a relatively stationary frame 9 portion of the mechanism structure 2. The silicon mechanism structure 2 is often fusion bonded to the second of the two silicon substrates 3, 4, shown as the silicon substrate 4 that forms the upper cover 6.

Silicon fusion bond joints B are often formed between one or both of the substrates 3, 4 and respective opposing surfaces 10, 11 of the mechanism structure 2 to form the covers 5, 6 of the MEMS device 1. Accordingly, respective surfaces 12, 13 of the substrates 3, 4 to be silicon fusion bonded are machined flat and highly polished to a mirror smooth finish of only few Ångströms that is suitable for silicon fusion bonding, as is known in the art.

As illustrated, one or both of the two silicon substrates 3, 4 that form the covers 5, 6 is formed with a respective depression 14, 15 that is recessed into a respective surface 12, 13 of the substrates 3, 4. The depressions 14, 15 are positioned to provide clearance for the flexibly suspended movable pendulum or other movable part 7 to move either in-plane or out-of-plane with respect to the relatively stationary frame 9 portion of the mechanism structure 2. The depressions 14, 15 are formed in a controlled manner to a depth D of a few microns to as little as a fraction of a micron to provided the necessary clearance.

According to state-of-the-art fabrication methods known in the prior art, the one or more depressions 14, 15 are typically formed by a slow and well-controlled etch process that permits precise control of the depression depths D. Such precise depth control is obtained by either isotropically or anistropically etching in a suitable etchant, such as potassium hydroxide (KOH) for anistropically etching. Wet etching in KOH is a slow and well-controlled process that permits very precise control of the depth D of the depressions 14, 15. The slow and well-controlled KOH etch process also results in a mirror smooth finish of only few Ångströms on respective floor surfaces 16, 17 of the depressions 14, 15.

FIG. 2 illustrates that the mirror smooth finish of floor surfaces 16, 17 of the depressions 14, 15 tends to be a drawback when the mechanism structure 2 is formed with one or more of the movable parts 7. For some applications requiring a high degree of sensitivity, the one or more flexures 8 are sufficiently compliant as to permit the movable part 7 to droop or sag toward one of the covers 5, 6 when the device is not powered. During fabrication, at the operation of fusion bonding the silicon mechanism structure 2 with one or both of the cover substrates 3, 4, droop or sag of the movable part 7 may permit one surface 18, 19 thereof to contact the opposing floor surface 16, 17 of the corresponding depression 14, 15 in the respective cover substrates 3, 4.

One drawback of the mirror smooth finish of floor surfaces 16, 17 of the depressions 14, 15 is that very shallow depressions 14, 15 having a depth D of only a fraction of a micron may permit sufficient contact area between one of the movable part surfaces 18, 19 and the floor surface 16, 17 of the corresponding depression 14, 15 that silicon fusion bonding occurs therebetween during fusion bonding of the mirror finished mechanism surfaces 10, 11 to the respective surfaces 12, 13 of the substrates 3, 4. Thus, a partial or even full silicon fusion bond joint F is developed between the movable part 7 and one of the covers 5, 6 as a result of the mirror smooth finish of floor surfaces 16, 17 of the depressions 14, 15, whereby the movable part 7 is rendered immovable.

SUMMARY OF THE INVENTION

The present invention is an apparatus and method for a silicon-based Micro-Electro Mechanical System (MEMS) device that overcomes limitations of the prior art by providing selectively roughened areas that obstruct fusion bonding of movable parts of a mechanism structure with corresponding surfaces of one or more cover structures.

Accordingly, the present invention provides a silicon-based MEMS device that includes a pair of silicon cover structures each having a substantially smooth and planar contact surface formed thereon; a silicon mechanism structure having a part thereof that is movably suspended relative to a relatively stationary frame portion thereof, the frame portion being formed with substantially parallel and spaced-apart smooth and planar contact surfaces, a relatively rough surface disposed between the contact surfaces of the covers and corresponding surfaces of the movable part of the mechanism structure; and wherein the contact surfaces of the cover structures form silicon fusion bond joints with the respective contact surfaces of the mechanism frame.

According to one aspect of the invention, respective portions of the contact surfaces of the cover structures each include the relatively rough surface.

According to another aspect of the invention, opposing surfaces of the movably suspended part of the mechanism structure each include the relatively rough surface.

According to another aspect of the invention, respective portions of the contact surfaces of the cover structures each include a depression therein corresponding to the movably suspended part of the mechanism structure.

According to another aspect of the invention, the relatively rough surface is a surface having a RMS surface roughness of greater than about 1.0 nanometer that is an obstruction to fusion bonding.

According to still other aspects of the invention, a method is provided for fabricating the device of the invention having the selectively roughened areas that obstruct fusion bonding.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 6-9 illustrate practice of the selectively roughened surface areas of the present invention for a silicon MEMS device of the invention that utilizes a silicon pendulum or other movable part that is structured for either in-plane or out-of-plane motion with respect to the silicon mechanism structure, wherein:

FIG. 6 illustrates a silicon substrate having a flat and highly polished contact surface that is suitable for silicon fusion bonding;

FIG. 7 illustrates selective roughening of the silicon substrate surface in selected areas of a substrate according to one embodiment of the present invention;

FIG. 8 illustrates formation of depressions in the silicon substrates that accommodate either in-plane or out-of-plane motion of the movable parts during operation of the MEMS device;

FIG. 9 illustrates recovery of the mirror smooth finish of only few Ångströms on surfaces of the respective silicon substrates.

DETAILED DESCRIPTION OF PREFERRED EMBODIMENT

In the Figures, like numerals indicate like elements.

The Figures illustrate the method of the present invention for a monolithic silicon-based Micro-Electro Mechanical System (MEMS) device, such as a sensor or actuator, having opposing cover structures having respective substantially smooth and planar contact surfaces that are silicon fusion bonded to substantially smooth and planar opposing surfaces of a frame portion of a silicon mechanism structure, the mechanism structure being formed with one or more parts that are movable relative to the frame portion of the mechanism structure, wherein a relatively rough surface is disposed between the contact surface of one or both of the cover structures and a corresponding surface of the movable part of the mechanism structure.

According to one embodiment of the present invention, the relatively rough surface is disposed on the contact surface of one or both of the cover structures in an area thereof corresponding to the movable part of the mechanism.

According to another embodiment of the present invention, the relatively rough surface is disposed on the movable part of the mechanism structure corresponding to one or both of the cover structures.

Figure 3:
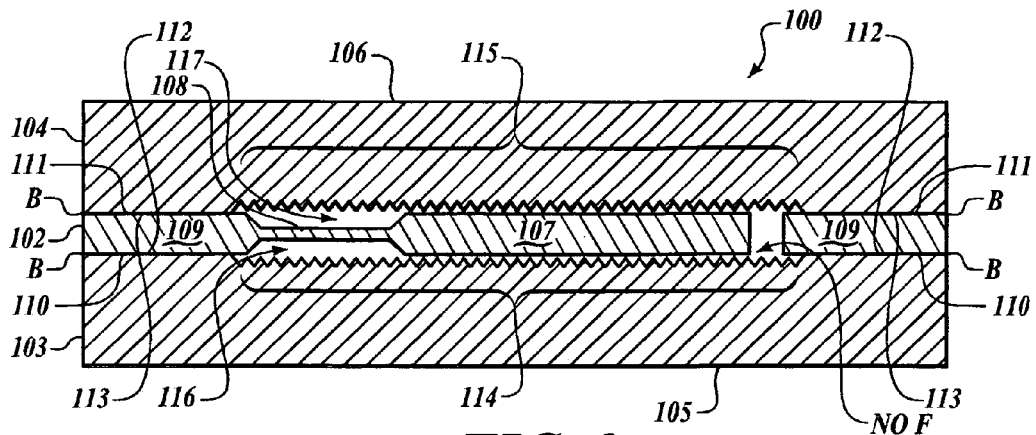
FIG. 3 is a simplified illustration of the apparatus of the present invention embodied as a silicon MEMS device having the selectively roughened surface areas of the present invention that is an obstruction to fusion bonding.

FIG. 3 is a simplified illustration of the apparatus of the present invention embodied as a MEMS device 100, such as a sensor or actuator, having a silicon mechanism 102 sandwiched between two silicon substrates 103, 104 that form respective cover structures 105, 106 over the mechanism 102. The mechanism 102 may be formed either from an independent silicon substrate or as an epitaxial layer of silicon grown on one of the two silicon substrates 103, 104 that form the respective covers 105, 106, for example the silicon substrate 103 that forms the lower cover 105. The silicon mechanism 102 includes one or more silicon movable parts 107 such as a pendulum that is flexibly suspended by one or more flexures 108 from a relatively stationary silicon frame 109 portion of the mechanism 102. The silicon mechanism 102 is fusion bonded to the second of the two silicon substrates 103, 104, shown as the silicon substrate 104 that forms the upper cover 106. Silicon fusion bond joints B as known in the prior art are formed between one or both of the two silicon substrates 103, 104 and respective substantially parallel and spaced-apart opposing contact surfaces 110, 111 of the silicon mechanism 102 to form the covers 105, 106 of the MEMS device 100.

The one or more movable parts 107 are optionally structured for out-of-plane motion with respect to the mechanism 102, i.e., up-down over the page.

Alternatively, as illustrated here, the one or more movable parts 107 are structured for in-plane motion with respect to the mechanism 102, i.e., either left-right across the page or into-out of the page (shown). Accordingly, respective contact surfaces 112, 113 of the silicon substrates 103, 104 to be silicon fusion bonded are machined substantially planar and highly polished to a mirror smooth finish of only a few Ångstroms that is suitable for silicon fusion bonding with the opposing substantially planar and mirror smooth contact surfaces 110, 111 of the silicon mechanism 102, as is known in the art. According to the present invention, the respective substrate surfaces 112, 113 are selectively roughened in one or more selected surface areas 114, 115 corresponding to one or more of the movable parts 107. The one or more selectively roughened surface areas 114, 115 include sufficient amounts of the respective substrate surfaces 112, 113 to accommodate assembly tolerances and motion of the movable parts 107 during operation of the MEMS device 100. The selectively roughened surface areas 114, 115 of the invention use one well-known limiting factor of silicon fusion bonding to overcome another well-known limiting factor of silicon fusion bonding. Surface roughness is used in the selected areas 114, 115 to overcome the tendency of mirror smooth movable parts 107 bonding with one or the other of the opposing mirror smooth surfaces 112, 113 of the respective substrates 103, 104 when the device 100 is assembled using otherwise conventional silicon fusion bonding technology. Surface roughness in the selectively roughened surface areas 114, 115 is in excess of the maximum surface roughness of only a few Ångstroms that permits effective silicon fusion bonding according to state-of-the-art conventional silicon fusion bonding technology. For example, surface roughness in the selectively roughened surface areas 114, 115 is in excess of the RMS roughness of only a few Ångstroms and significantly more than 1.0 nanometer that is known in the prior art to be a general requirement for direct wafer fusion bonding. Fusion bonding is thereby obstructed in the selectively roughened surface areas 114, 115. The selectively roughened surface areas 114, 115 of the present invention thus teach away from the use of mirror smooth finishes of only a few Ångstroms that is taught by conventional wisdom and state-of-the-art silicon fusion bonding practices for fabricating MEMS devices by bonding together two or more different silicon wafers as disclosed in the prior art. As a result, the selectively roughened surface areas 114, 115 of the present invention prevent formation of the silicon fusion bond joint F between the mechanism moving parts 107 and one or the other of the opposing mirror smooth surfaces 112, 113 of the respective substrates 103, 104 during assembly of the device 100.

Figure 4:
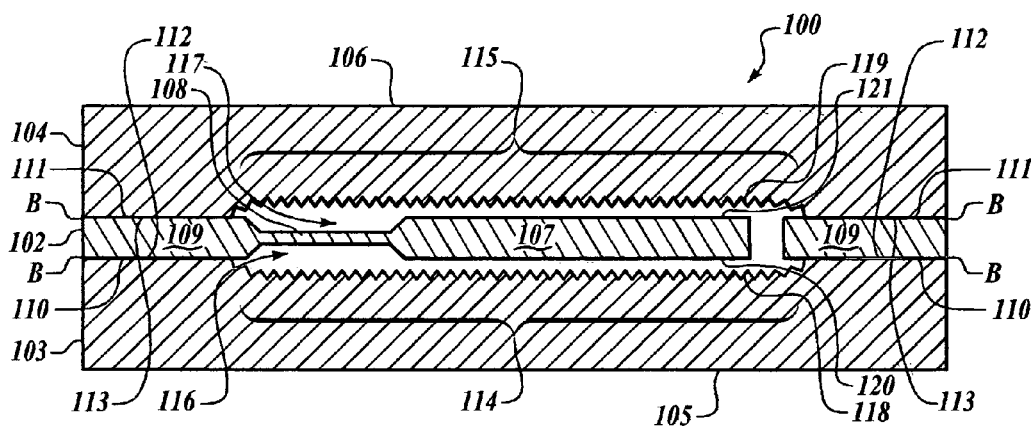
FIG. 4 is another simplified illustration of the apparatus of the present invention embodied as a silicon MEMS device having the selectively roughened surface areas of the present invention wherein a movable part is structured to move either in-plane or out-of-plane with respect to a silicon mechanism structure.

FIG. 4 is another simplified illustration of the apparatus of the present invention embodied as a MEMS device 100 wherein one or both of the two silicon substrates 103, 104 that form the covers 105, 106 is formed with a respective depression 116, 117 that is recessed into respective surface 112, 113 of the substrates 103, 104. The depressions 116, 117 are positioned to provide clearance for the flexibly suspended pendulum or other movable part 107 to move either in-plane or out-of-plane with respect to the relatively stationary silicon frame 109 portion of the mechanism 102, i.e., up-down over the page. The depressions 116, 117 are formed to a depth D as a function of the application. The depth D is a few microns to as little as a fraction of a micron to provided at least a minimum clearance for out-of-plane movement of the one or more mechanism movable parts 107 during operation of the MEMS device 100.

Figure 1:
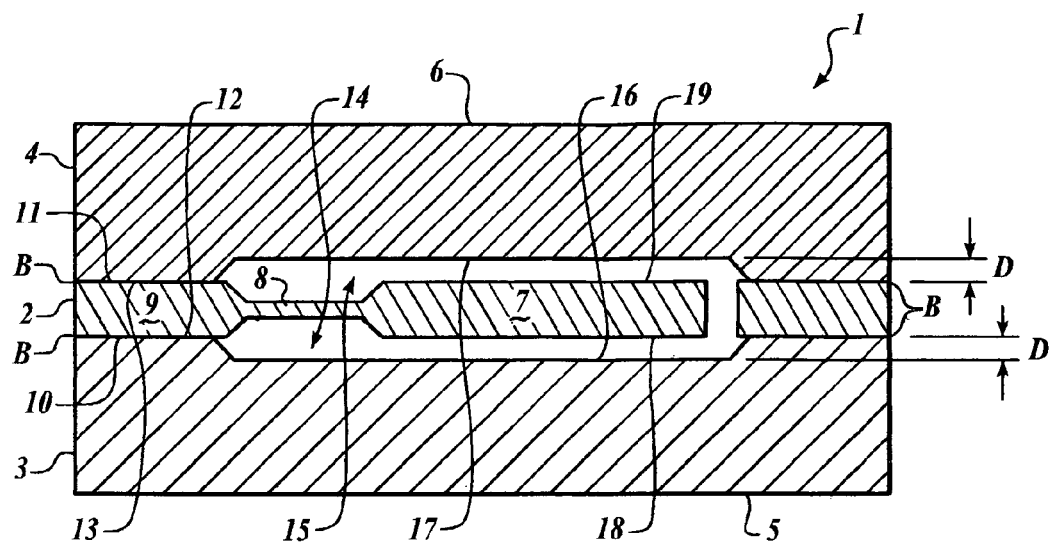
FIG. 1 is a simplified illustration of a generic silicon MEMS device of the prior art.
Figure 2:
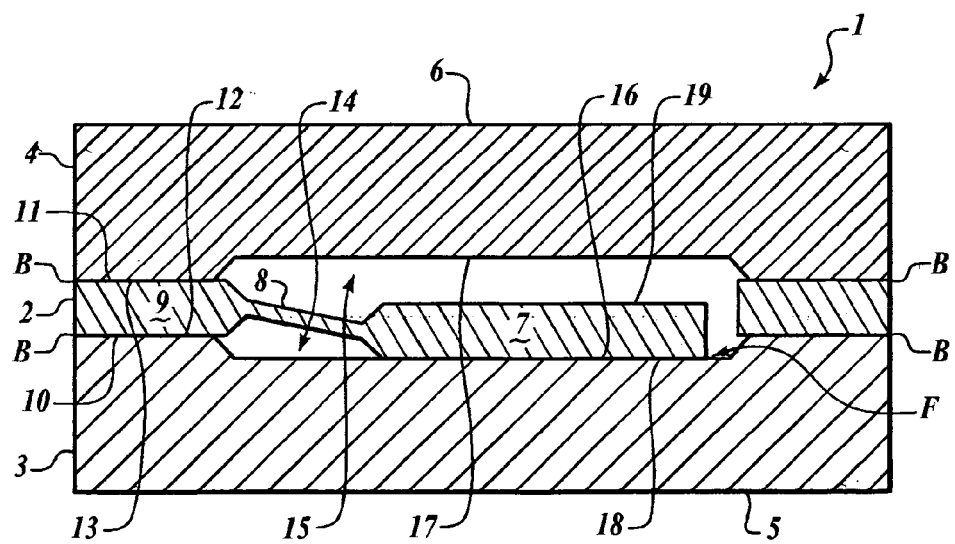
FIG. 2 is a simplified illustration showing the generic prior art silicon MEMS device illustrated in FIG. 1 with a movable part of a silicon mechanism structure contacting a clearance depression in an opposing cover.

Surface roughness is used in the selected areas 114, 115 on respective floor surfaces 118, 119 of the depressions 116, 117 to overcome the tendency of mirror smooth movable parts 107 bonding to one or the other of the respective floor surfaces 118, 119 when the device 100 is assembled using otherwise conventional silicon fusion bonding technology. In contrast to the mirror smooth finish of the respective floor surfaces 16, 17 (shown in FIGS. 1 and 2) as known and practiced in the prior art, surface roughness in the selectively roughened surface areas 114, 115 of the respective floor surfaces 118, 119 is in excess of the maximum surface roughness of only few Ångströms that permits effective silicon fusion bonding according to state-of-the-art conventional silicon fusion bonding technology. Fusion bonding is thereby obstructed in the selectively roughened surface areas 114, 115.

Figure 5:
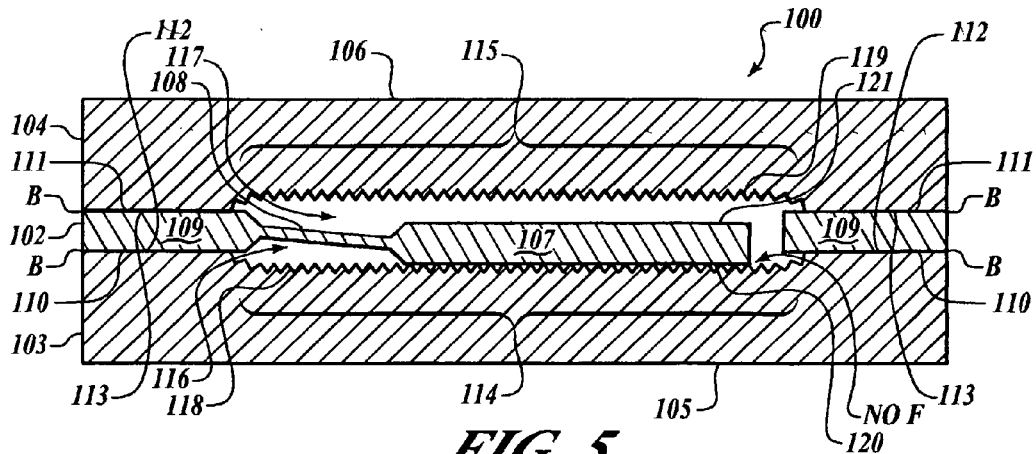
FIG. 5 is another simplified illustration of the apparatus of the present invention embodied as a silicon MEMS device having the selectively roughened surface areas of the present invention wherein a movable part is illustrated as drooping or sagging against one cover structure during fusion bonding of the MEMS device.

FIG. 5 illustrates that the selectively roughened surface areas 114, 115 of the respective floor surfaces 118, 119 of the depressions 116, 117 is an obstruction to fusion bonding with the mirror smooth finish of either of surface 120, 121 of the movable part 107. The selectively roughened surface areas 114, 115 of the present invention prevent contact sufficient for effective fusion bonding to occur even if the movable part 107 droops or sags during the silicon fusion bonding operation. The selectively roughened surface areas 114, 115 thus contrast with the mirror smooth finish of floor surfaces 16, 17 of the depressions 14, 15 (shown in FIGS. 1 and 2) as taught by the prior art that tends to be a drawback when the movable part 7 droops or sags into contact with one of the floor surfaces 16, 17 during the silicon fusion bonding operation and the silicon fusion bond joint F is prevented.

FIGS. 6-9 illustrate the practice of the present invention for a MEMS device 100 of the invention that utilizes a movable pendulum or other movable part 107 that moves either in-plane or out-of-plane with respect to the relatively stationary frame 109 portion of the mechanism 102 during operation.

Figure 6:
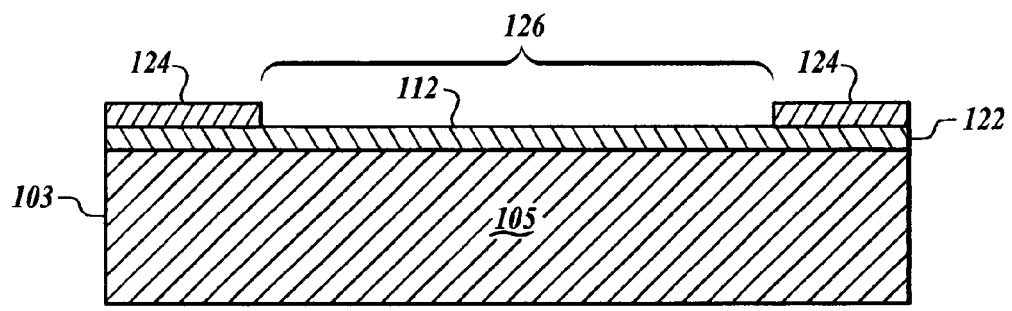

FIG. 6 illustrates one of the silicon cover substrates 103 having the contact surface 112 machined flat and highly polished to a mirror smooth finish of only few Ångströms that is suitable for silicon fusion bonding, as is known in the art. The polished contact surface 112 is formed with a layer of a sacrificial film 122, such as a silicon oxide or nitride, that is patterned with a positive or negative photoresist mask 124 that exposes one or more portions 126 of the sacrificial film layer 122 corresponding to respective locations of the movable parts 107.

Figure 7:
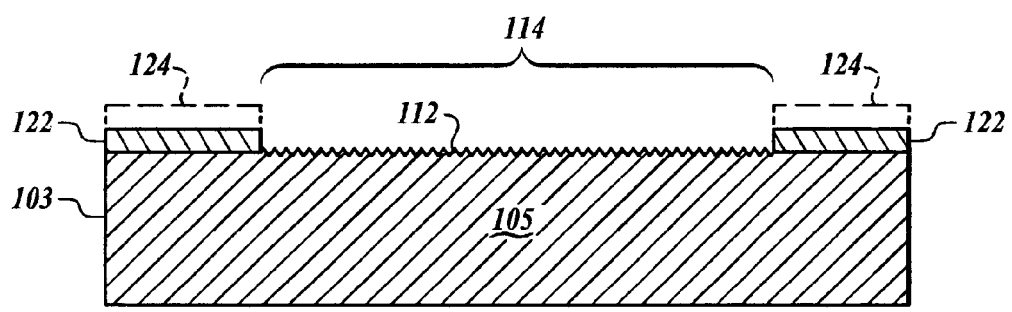

FIG. 7 illustrates selective roughening of the substrate surface 112 in the selected areas 114. The photoresist mask 124 (shown dashed) is removed. The one or more portions 126 of the sacrificial film layer 122 corresponding to the location of the movable parts 107 are selectively removed down to the substrate surface 112. The mirror smooth finish of the substrate surface 112 is wet or dry etched to forms the selectively roughened surface 114 in areas exposed by the selectively removed portions 126 of the sacrificial film layer 122. By example and without limitation, the substrate surface 112 is selectively roughened in the selected areas 114 by Reactive Ion Etching (RIE) or Deep Reactive Ion Etching (DRIE). Both RIE and DRIE are plasma etch techniques that etch faster than the slow and well-controlled KOH etch process utilized in state-of-the-art fabrication methods that permits precise control of the etch. Both RIE and DRIE permit less precise depth control. RIE and DRIE are believed to result in finishes on the etched surface 114 that are at least several Ångströms and range to as much as several hundred Ångströms. Thus, RIE and DRIE also result in finishes on the etched surfaces 114 that are at least rougher than the maximum surface roughness of only few Ångströms that permits effective silicon fusion bonding. Fusion bonding is thereby obstructed in the selectively roughened surface areas 114.

Regardless of whether the one or more movable parts 107 are structured for in-plane or out-of-plane motion with respect to the relatively stationary frame 109 portion of the mechanism 102, the substrates 103, 104 that form the respective covers 105, 106 constrain the movable parts 107 from undue out-of-plane motion during operation of the MEMS device 100, while the selectively roughened surfaces 114 and 115 of the silicon substrates 103, 104 prevent unintentional fusion bonding of the movable parts 107 during silicon fusion bonding of the mechanism 102 with the silicon substrates 103, 104.

Figure 8:
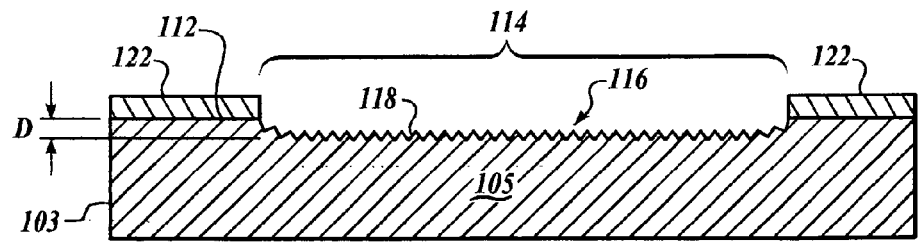

FIG. 8 illustrates formation of the depressions 116, 117 in the silicon substrates 103, 104 that accommodate limited out-of-plane motion of the movable parts 107 during operation of the MEMS device 100. The RIE, DRIE or other etch process that forms the roughened surfaces 114 and 115 of the silicon substrates 103, 104 is extended to etch the depressions 116, 117 to the depth D appropriate for the application of the MEMS device 100. The RIE, DRIE or other etch process that forms the depressions 116, 117 provides less precise control of the depth D. However, according to the present invention, the RIE, DRIE or other etch process forms the respective floor surfaces 118, 119 of the depressions 116, 117 with the roughened surfaces 114 and 115 of the invention that prevent unintentional fusion bonding of the movable parts 107 during fusion bonding of the silicon mechanism 102 with the silicon substrates 103, 104.

Figure 9:
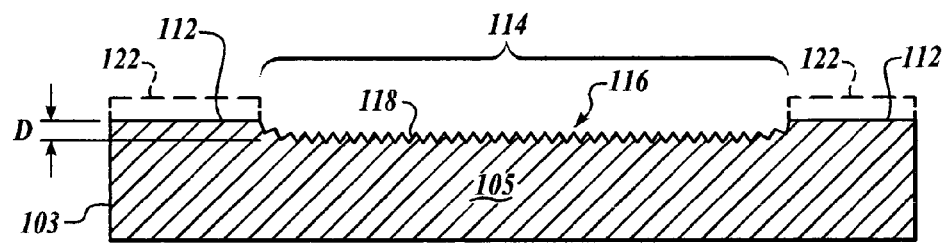

FIG. 9 illustrates removal of the remaining portions of the sacrificial film 122 (shown dashed) using a conventional etch technology that recovers the mirror smooth finish of only few Ångströms on respective surfaces 112, 113 of the respective silicon substrates 103, 104.

According to one embodiment of the present invention, the surfaces 112, 113 are recovered by isotropically or anistropically etching in a suitable etchant, such as potassium hydroxide (KOH) for anistropically etching. As is well-known in the art and discussed herein, wet etching in KOH is a slow and well-controlled process that results in a mirror smooth finish of only few Ångströms on the substrate surfaces 112, 113. Thus, the recovered substrate surfaces 112, 113 are sufficiently smooth for effective fusion bonding with the silicon mechanism 102.

Figure 10:
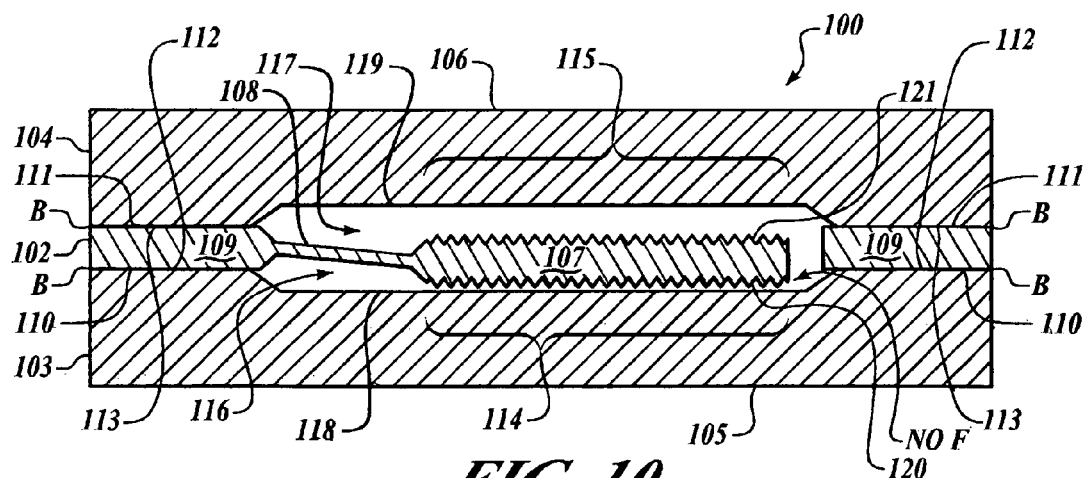
FIG. 10 illustrates another alternative embodiment of the MEMS device of the present invention wherein the one or more movable parts of the silicon mechanism structure are formed with the roughened surfaces of the invention.

FIG. 10 illustrates another alternative embodiment of the MEMS device 100 of the present invention wherein the one or more movable parts 107 of the silicon mechanism 102 are formed with the roughened surfaces 114 and 115 of the invention. Meanwhile, the mirror smooth finish of only few Ångströms remains substantially entire and intact on respective surfaces 112, 113 of the respective silicon substrates 103, 104. Rather, the opposing surfaces 120, 121 of the silicon movable part 107 are etched using the RIE, DRIE or other etch process that forms the roughened surfaces 114 and 115 of the invention. However, the opposing surfaces 110, 111 of the stationary frame 109 portion of the silicon mechanism 102 retains the mirror smooth finish of only few Ångströms for effective formation of the silicon fusion bond joints B as known in the prior art with respective surfaces 112, 113 of the respective silicon substrates 103, 104 that form the covers 105, 106 of the MEMS device 100.

As illustrated here, the respective silicon substrates 103, 104 are formed with the depressions 116, 117 that provide clearance for the movable part 107 to move out-of-plane with respect to the silicon mechanism 102. The respective depression floor surfaces 118, 119 are formed using a suitable etchant, such as KOH, that permits precise control of the etch depth D. The respective depression floor surfaces 118, 119 are thus formed with the mirror smooth finish of the as known and commonly practiced in the prior art.

The selectively roughened surface areas 114, 115 of the present invention formed on the opposing surfaces 120, 121 of the silicon movable part 107 prevent contact sufficient for effective fusion bonding to occur with the mirror finish depression floor surfaces 118, 119, even if the movable part 107 droops or sags during the silicon fusion bonding operation. The selectively roughened surface areas 114, 115 of the silicon movable part 107 thus contrast with the mirror smooth finish of depression floor surfaces 118, 119 during the silicon fusion bonding operation and the silicon fusion bond joint F is prevented. The selectively roughened surface areas 114, 115 of the present invention thus overcome the tendency of drooping or sagging silicon movable parts 107 to bond with one or the other of the respective floor silicon surfaces 118, 119 when the device 100 is assembled according to state-of-the-art conventional silicon fusion bonding technology as taught by the prior art.

While the preferred embodiment of the invention has been illustrated and described, it will be appreciated that various changes can be made therein without departing from the spirit and scope of the invention.

What is claimed is:

1. A silicon-based Micro-Electro Mechanical System (MEMS) device, comprising:

a silicon cover structure having a substantially smooth and planar contact surface;

a silicon mechanism structure having a part thereof that is movable relative to a frame portion thereof, the frame portion being formed with a substantially smooth and planar contact surface;

a silicon fusion bond joint formed between the contact surfaces of the cover and mechanism structures; and a relatively rough surface disposed between the contact surface of the cover and the movable part of the mechanism structure.

2. The device of claim 1 wherein a portion of the contact surface of the cover further comprises the relatively rough surface.

3. The device of claim 2 wherein the portion of the contact surface of the cover comprising the relatively rough surface further comprises a depression having the relatively rough surface disposed on a floor surface thereof.

4. The device of claim 1 wherein a surface of the movable part of the mechanism structure further comprises the relatively rough surface.

5. The device of claim 4 wherein a portion of the contact surface of the cover further comprises a depression therein corresponding to the movable part of the mechanism structure.

6. The device of claim 1 wherein the relatively rough surface further comprises a surface having a RMS surface roughness of greater than about 1.0 nanometer.

7. The device of claim 6 wherein the movable part further comprises a movable part that is structured for either in-plane or out-of-plane motion relative to the frame portion of the mechanism structure.

8. A silicon-based Micro-Electro Mechanical System (MEMS) device, comprising:

a pair of silicon cover structures each having a substantially smooth and planar contact surface formed thereon;

a silicon mechanism structure having a part thereof that is movably suspended relative to a relatively stationary frame portion thereof, the frame portion being formed with substantially parallel and spaced-apart smooth and planar contact surfaces;

a relatively rough surface disposed between the contact surfaces of the covers and corresponding surfaces of the movable part of the mechanism structure, the relatively rough surface having a RMS surface roughness of greater than about 100 Ångströms; and wherein the contact surfaces of the cover structures form silicon fusion bond joints with the respective contact surfaces of the mechanism frame.

9. The device of claim 8 wherein respective portions of the contact surfaces of the cover structures each further comprises the relatively rough surface.

10. The device of claim 9 wherein the respective portions of the cover contact surfaces comprising the relatively rough surface each further comprises a depression sized to admit the movably suspended part of the mechanism structure and having the relatively rough surface disposed on a floor surface thereof.

11. The device of claim 8 wherein opposing surfaces of the movably suspended part of the mechanism structure each further comprises the relatively rough surface.

12. The device of claim 11 wherein respective portions of the contact surfaces of the cover structures each further comprises a depression therein corresponding to the movably suspended part of the mechanism structure.

13. The device of claim 8 wherein the relatively rough surface further comprises a surface having a RMS surface roughness of greater than about 1.0 nanometer.

14. The device of claim 13 wherein the movably suspended part of the mechanism structure further comprises a movable part that is movably suspended for one of in-plane and out-of-plane motion relative to the stationary frame portion of the mechanism structure.

15. A silicon-based Micro-Electro Mechanical System (MEMS) device comprising:

a silicon cover structure having a substantially smooth and planar contact surface;

a silicon mechanism structure having a part thereof that is movable relative to a frame portion thereof, the frame portion being formed with a substantially smooth and planar contact surface; and a silicon fusion bond joint formed between the contact surfaces of the cover and mechanism structures, wherein at least one of the silicon cover structure or the moveable part includes a relatively rough monolithic surface disposed between the contact surface of the cover and the movable part of the mechanism structure, the relatively rough surface having a RMS surface roughness of greater than about 10 Ångstroms.

\* \* \* \* \*